(12) United States Patent
Testi et al.

(10) Patent No.: US 8,941,441 B2
(45) Date of Patent: Jan. 27, 2015

(54) LNA WITH LINEARIZED GAIN OVER EXTENDED DYNAMIC RANGE

(71) Applicant: Innophase, Inc., Chicago, IL (US)

(72) Inventors: Nicolo Testi, Chicago, IL (US); Xi Li, Allen, TX (US); Xuejun Zhang, Chicago, IL (US); Yang Xu, Chicago, IL (US)

(73) Assignee: Innophase Inc., Chicago, IL (US)

( * ) Notice: Subject to any disclaimer, the term of this patent is extended or adjusted under 35 U.S.C. 154(b) by 80 days.

(21) Appl. No.: 13/839,462

(22) Filed: Mar. 15, 2013

(65) Prior Publication Data

US 2014/0266454 A1    Sep. 18, 2014

(51) Int. Cl.
*H03F 3/45*    (2006.01)

(52) U.S. Cl.
USPC ............................ 330/254; 330/305; 330/306

(58) Field of Classification Search
USPC ......................................... 330/254, 305, 306
IPC .......................................................... H03F 3/45
See application file for complete search history.

(56) References Cited

U.S. PATENT DOCUMENTS

| | | | |
|---|---|---|---|
| 5,091,701 A * | 2/1992 | Butler | 330/252 |
| 6,684,065 B2 * | 1/2004 | Bult et al. | 455/252.1 |
| 7,158,766 B2 * | 1/2007 | Imayama et al. | 455/130 |
| 7,323,945 B2 * | 1/2008 | Cyr et al. | 331/16 |
| 7,710,199 B2 * | 5/2010 | Bocock et al. | 330/258 |
| 8,089,323 B2 * | 1/2012 | Tarng et al. | 331/117 FE |
| 8,244,195 B2 * | 8/2012 | Wilson | 455/253.2 |
| 2004/0100330 A1 | 5/2004 | Chandler | |
| 2008/0220735 A1 | 9/2008 | Kim et al. | |
| 2013/0082688 A1 * | 4/2013 | Horvath | 324/120 |

FOREIGN PATENT DOCUMENTS

| | | |
|---|---|---|
| EP | 1187313 | 3/2002 |
| JP | 07221570 | 8/1995 |
| JP | 11088064 | 3/1999 |

OTHER PUBLICATIONS

International Search Report and Written Opinion for PCT/US2014/026459 mailed Jul. 28, 2014.

* cited by examiner

*Primary Examiner* — Patricia Nguyen
(74) *Attorney, Agent, or Firm* — Invention Mine LLC

(57) ABSTRACT

A low noise amplifier including a variable gain amplifier stage configured to accept an input signal and to provide a load driving signal; a tunable bandpass filter connected as a load to the variable gain amplifier stage, wherein the bandpass filter includes a cross-coupled transistor pair, and at least one cross-coupled compensation transistor pair biased in a subthreshold region configured to add a transconductance component when the load driving signal is of a magnitude large enough to decreases a transconductance of the cross-coupled transistor pair; and, a controller circuit configured to tune the bandpass filter. The filter can be tuned in respect to the frequency and the quality factor Q.

20 Claims, 11 Drawing Sheets

LNA WITH LINEARIZED GAIN OVER EXTENDED DYNAMIC RANGE

CROSS REFERENCE TO RELATED APPLICATIONS

This application is related to the following co-pending applications, filed on even date herewith, all of which are incorporated herein by reference in their entirety: U.S. patent application Ser. No. 13/840,478 filed Mar. 15, 2013, entitled POLAR RECEIVER SIGNAL PROCESSING AND ARCHITECTURE; U.S. patent application Ser. No. 13/839,557, filed Mar. 15, 2013, entitled POLAR RECEIVER SIGNAL PROCESSING APPARATUS AND METHODS; U.S. application Ser. No. 13/840,379 filed Mar. 15, 2013, entitled DIGITALLY CONTROLLED INJECTION LOCKED OSCILLATOR; and, U.S. application Ser. No. 13/842,470, filed Mar. 15, 2013, entitled SINGLE-BIT DIRECT MODULATION TRANSMITTER.

BACKGROUND OF THE INVENTION

Low Noise Amplifiers are circuits for amplifying weak signals such as those received from antennas. It is important that they not introduce much noise given the weak power levels of the received signal. Otherwise, the signal to noise ratio (SNR) of the signal would be unacceptable for data recovery. The effect of the injected noise may be reduced by the gain of the LNA. As such, there is a need for improved LNAs, including those for use in direct conversion transceivers.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
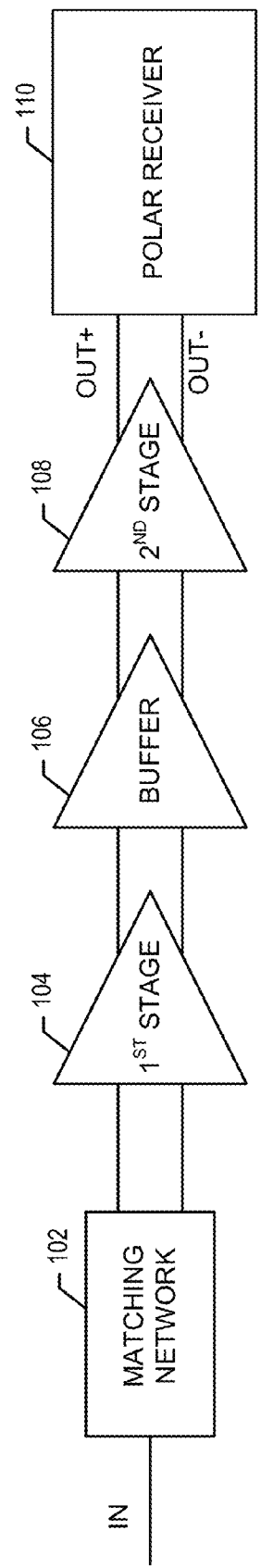
FIG. 1 is a block diagram of a LNA architecture in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

Figure 6:
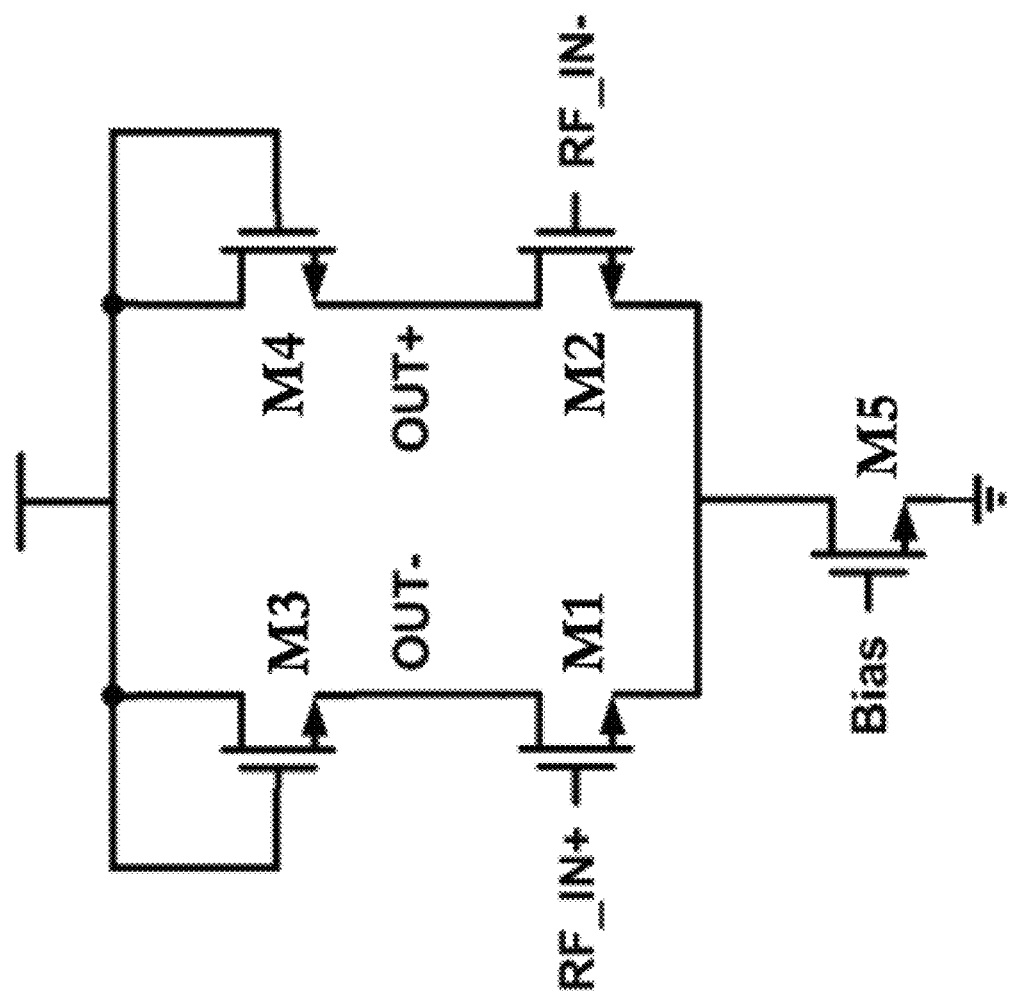
FIG. 6 is a circuit diagram of a buffer in accordance with some embodiments.

With reference to FIG. 1, an embodiment of a low noise amplifier in accordance with some embodiments will be described. A received signal, such as from an antenna, is received by the matching network 102. The output of the matching network is provided to the first LNA stage 104, the output of which is connected via buffer 106 to the second LNA stage 108. The buffer circuit is depicted in FIG. 6.

The output of the cascaded LNA stages is further processed in a receiver, such as a polar receiver 110. Additional details of the polar receiver may be found in the co-pending application Ser. No. 13/840,478 filed Mar. 15, 2013, entitled POLAR RECEIVER SIGNAL PROCESSING AND ARCHITECTURE. Other well-known receiver architectures may also be used. Each stage of the two LNA stages 104, 108 may be tuned to exhibit a bandpass response. The two center frequencies, one from each stage, may be offset to provide an overall wider frequency bandwidth, yet still providing a high degree of off-band selectivity so as to reject adjacent channels.

Figure 2:
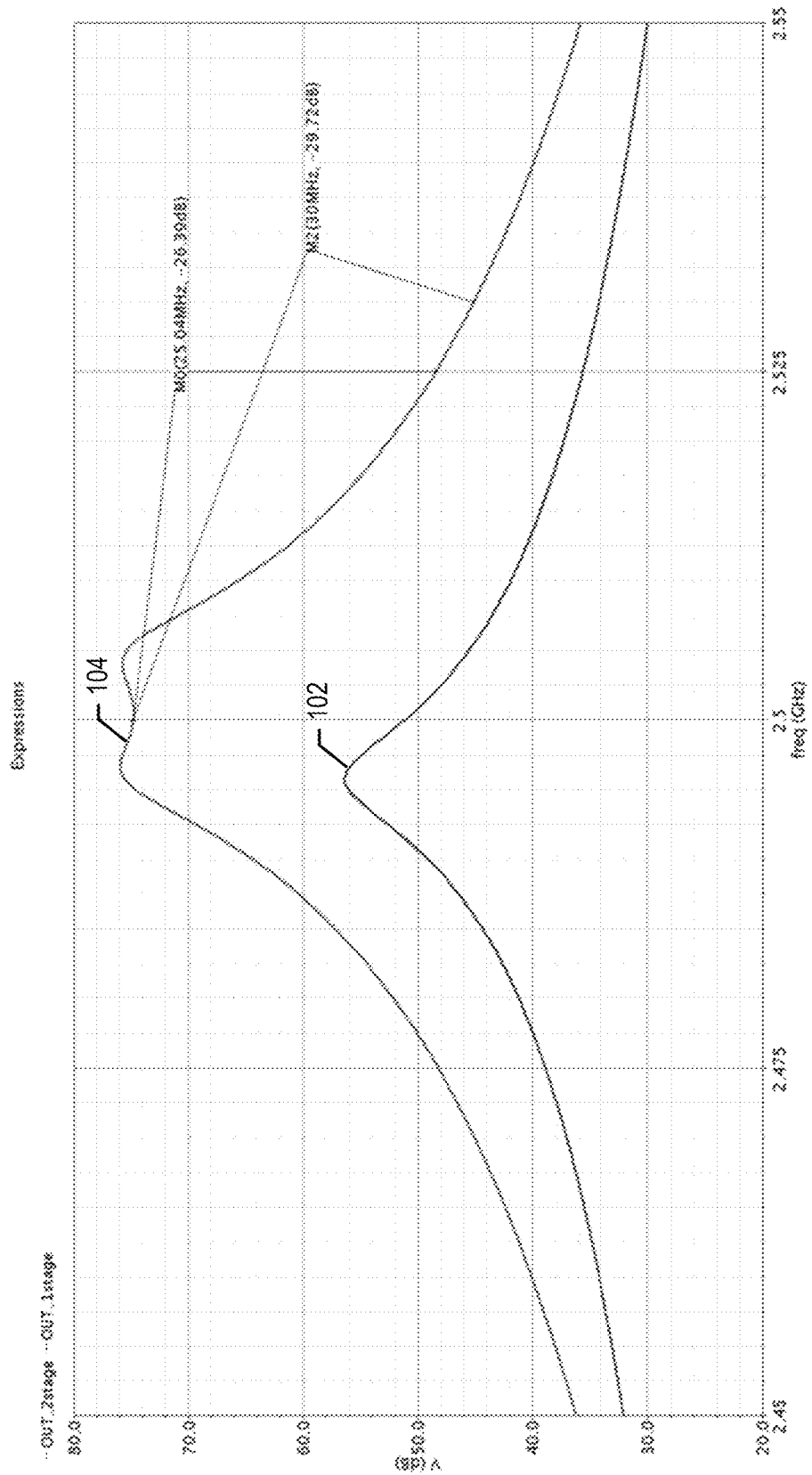
FIG. 2 is a plot of the frequency response of LNAs in accordance with some embodiments.

With reference to FIG. 2, the frequency response of the first stage is shown in plot 102, while the aggregated response of the frequency-staggered stages is shown in plot 104.

Figure 3:
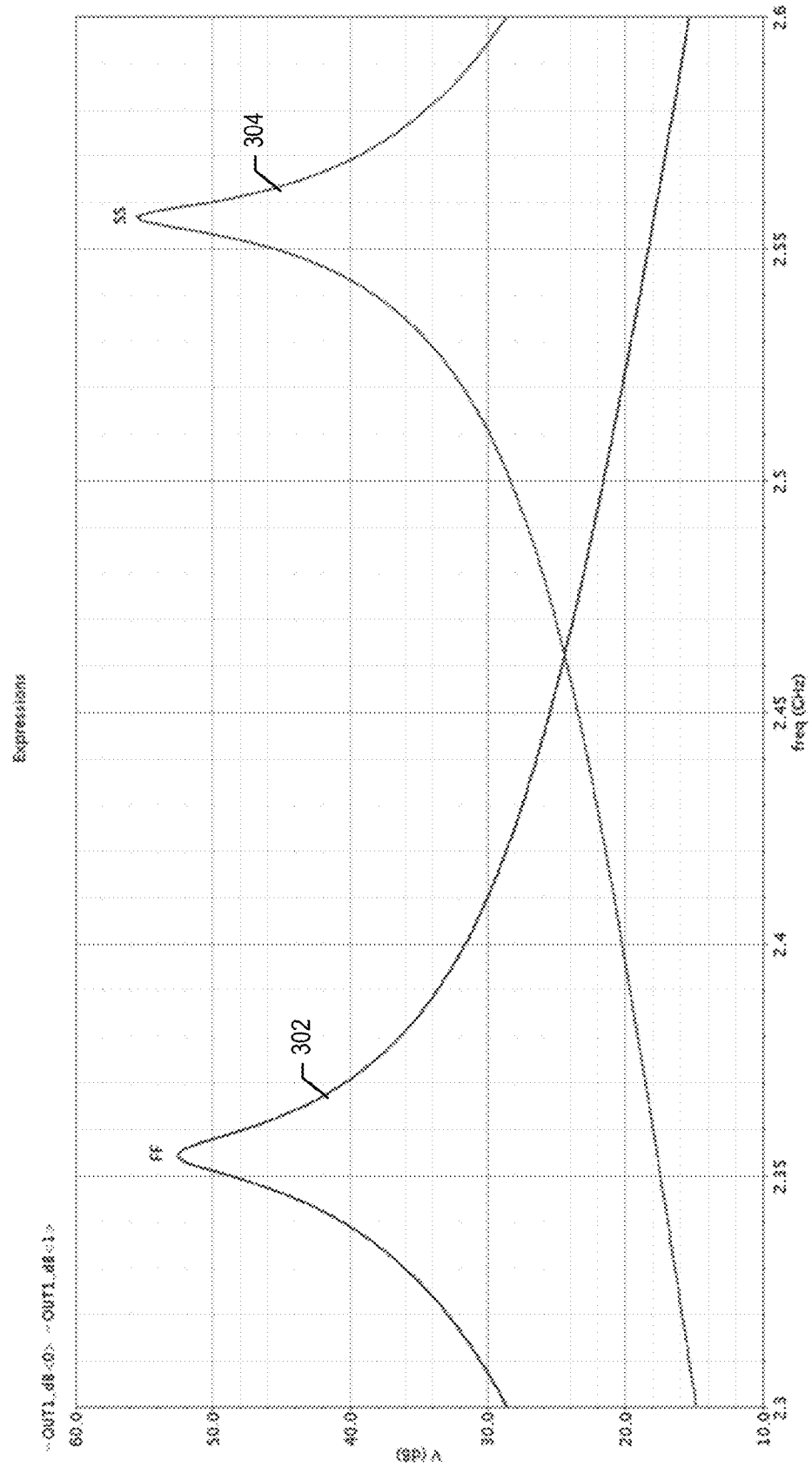
FIG. 3 is a block diagram of a configurable LNA frequency tuning in accordance with some embodiments.

With reference to FIG. 3, plots 302 and 304 both represent the response of the first stage. FIG. 3 shows that the center frequency of the filter may be tuned across the desired frequency band in the worst process corners.

Figure 4:
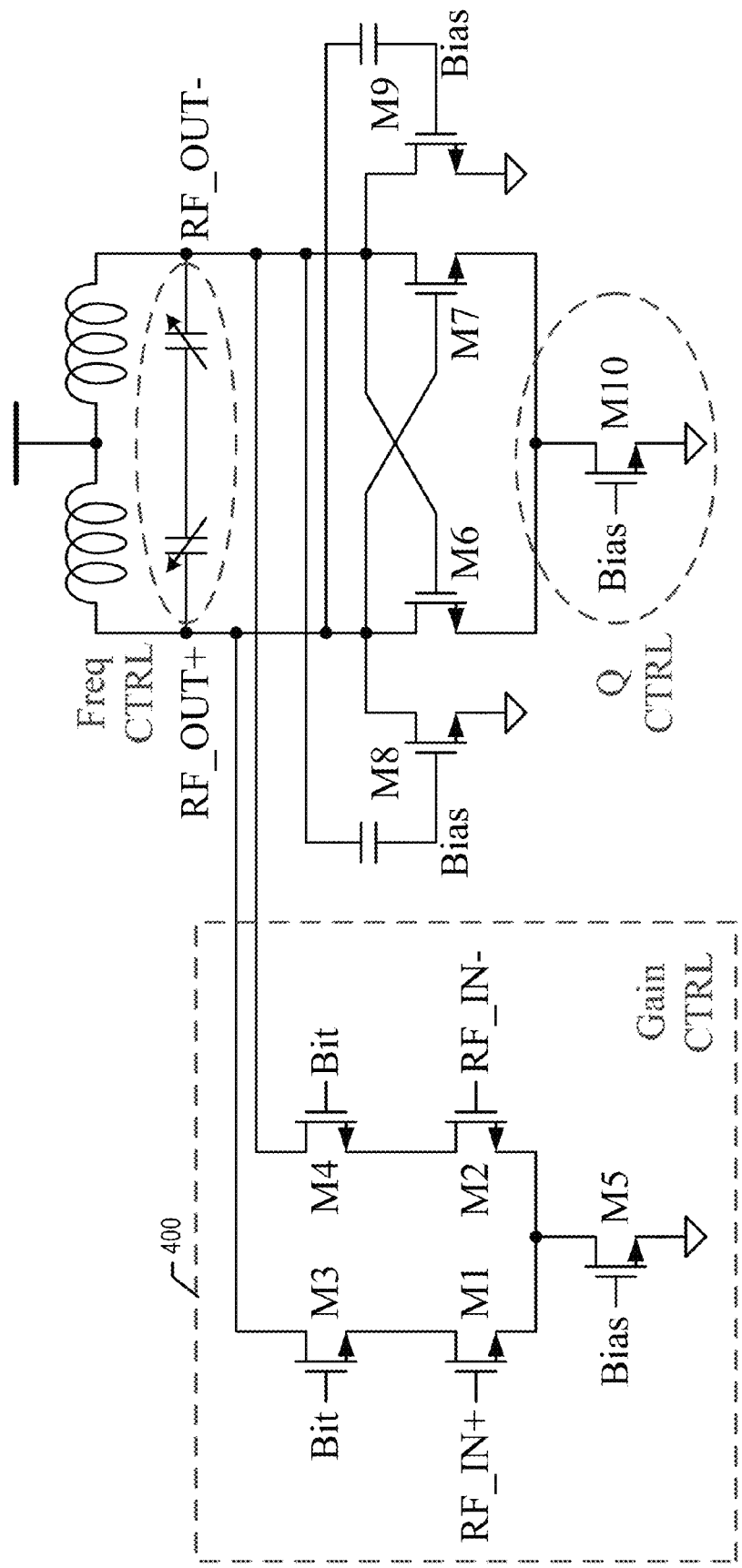
FIG. 4 is a circuit diagram of one embodiment of an adjustable LNA stage in accordance with some embodiments.

With reference to FIG. 4, the tunable LNA stage is depicted. The variable gain stage including the differential pair M1, M2, and the control FETs M3, M4 controlled by a Bit signal from the controller, is configured to provide a variable transconductance gain to drive the bandpass filter load. The LNA stage may include a plurality of switchable transconductance cells such as those shown in FIG. 5. The controller may use a binary code to adjust the gain, wherein each cell provides twice the gain of the prior cell. In addition, or as an alternative, some or all of the gain stage cells may provide equal amounts of gain, and may be controlled by a thermometer code control signal.

Figure 7:
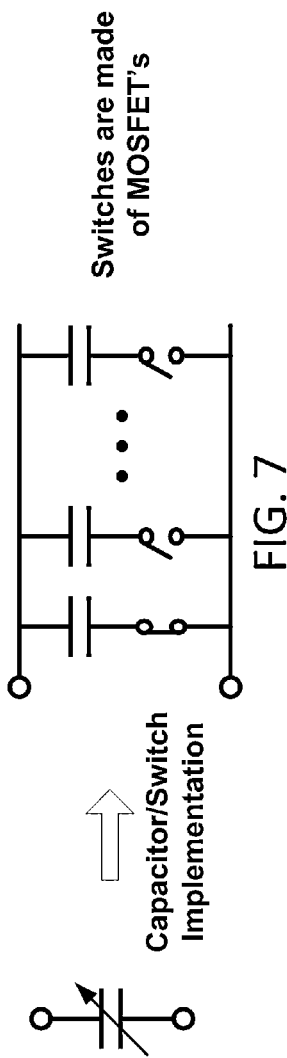
FIGS. 7 and 8 are implementations of capacitor banks in accordance with some embodiments.
Figure 8:
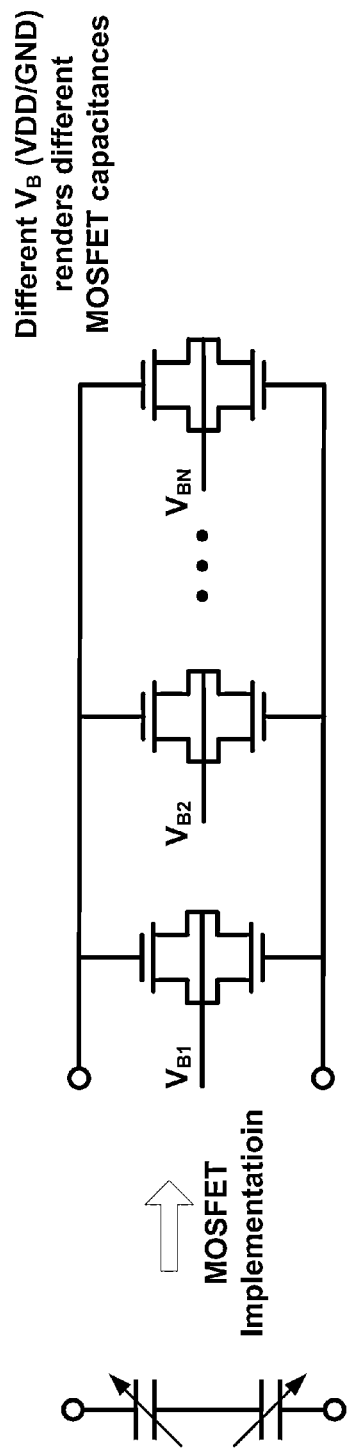

Again with respect to FIG. 4, the bandpass filter acting as the load for the transconductance gain stage includes an adjustable, or tunable tank circuit with frequency control (Freq CTRL). The tank circuit may be an LC tank as shown, or may alternatively be an RC tank circuit. The adjustable capacitors may take the form of a capacitor bank, such as that depicted in FIGS. 7 and 8. Each capacitor may be controlled individually by using a separate bit to control its corresponding switch. The capacitors in the capacitor bank may take the same value or different values such that each bit controls a capacitance cell having a proportionally larger amount of capacitance. Capacitance variations may be accomplished by using varying configurations of serially connected and/or parallel connected capacitors, by using different device sizes, or by using different bias voltages, as just a few examples of embodiments of a capacitance bank.

The bandpass filter also include cross-coupled transistors M6, M7 to complete the bandpass load. Note the cross-coupled compensation transistor pair M8, M9. These cross-coupled compensation transistors are biased in a sub-threshold region.

In small signal analysis the two currents flowing into M6 (I1) and M8 (I2) can be written as:

$$I1 = gm_{M6,1} \cdot V_{RF\ OUT-} + gm_{M6,2} \cdot V_{RF\ OUT-}^2 + gm_{M6,3} \cdot V_{RF\ OUT-}^3,$$

$$I2 = gm_{M8,1} \cdot V_{RF\ OUT-} + gm_{M8,2} \cdot V_{RF\ OUT-}^2 + gm_{M8,3} \cdot V_{RF\ OUT-}^3.$$

Where $gm_{M6,1}$, $gm_{M6,2}$, $gm_{M6,3}$, $gm_{M8,1}$, $gm_{M8,2}$ and $gm_{M8,3}$ are respectively the first, second and third terms in the Taylor expansion of the current for transistors M6 and M8. The first order term corresponds to the regular small signal gm. For a transistor biased in saturation, the third order term is negative. So if the amplitude of the input signal increases, the current starts to compress. On the contrary, for a transistor biased in the sub-threshold region, the third order term is positive. So if the amplitude of the input signal increases, the current increases accordingly. In FIGS. 4 M6 and M7 are biased in saturation, while M8 and M9 are in sub-threshold. So it is possible to have $gm_{M6,3} = -gm_{M8,3}$ using the proper transistor sizing and bias. In this way the total current in each branch results:

$$I_{tot} = I1 + I2 = (gm_{M6,1} + gm_{M8,1}) \cdot V_{in} + (gm_{M6,2} + gm_{M8,2}) \cdot V_{in}^2.$$

Because the signals applied to the two branches are differential, the second order term $(gm_{M6,2} + gm_{M8,2}) \cdot V_{in}^2$ is canceled. In this way, the linear range of the cross-coupled transistor pair M6, M7 is extended by the cross-coupled compensation pair M8, M9.

Figure 9:
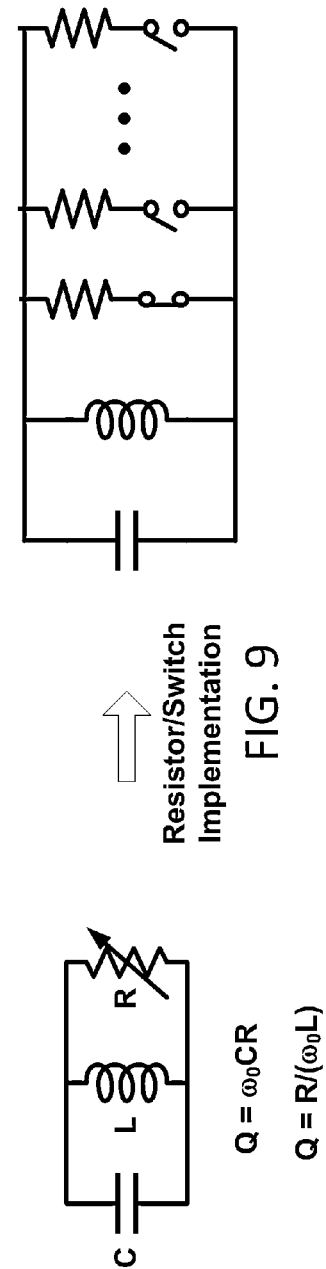
FIG. 9 is an implementation of a resistor bank in accordance with some embodiments.

The quality factor Q of the bandpass load may also be adjusted. In one embodiment, the bias on transistor M10 is adjusted. A very high Q may be used, even as high as 400 or 500, while still maintaining a linearized response from the bandpass load at high output swing (100 mVp). The high-Q tank, or bandpass load, presents a large resistance to the transconductance gain stage, which will therefore produce a large gain from a small current signal. Note also that the high Q provides narrow band selection and high rejection of adjacent bands or channels. The Q may also be reduced by selectively inserting resistances in the tank circuit under the control of the LNA control circuit. Such as resistor bank may be realized as depicted in FIG. 9.

Because the high quality factor Q becomes extremely sensitive to the value of transconductance of the cross-coupled pair, $-g_m/2$, small variations of $g_m$ may result in a large variation of Q. Thus, linearizing the transconductance of M6 and M7 with the insertion of the sub-threshold biased cross-coupled compensation transistor pair greatly increases the dynamic range of the LNA stages. Without this compensation, a decrease in the Q factor due to large output swing will reduce the gain and increase the response bandwidth, and result in less adjacent channel rejection.

Note also that while the addition of the cross-coupled compensation transistor pair may generate some additional noise, the compensation pair is part of the load, and any additional noise is relatively insignificant because it is not passing through the amplification stage. That is, the noise is injected at the output of the amplifier rather than the input, and thus has a minor impact, especially in a very high gain LNA.

Figure 10:
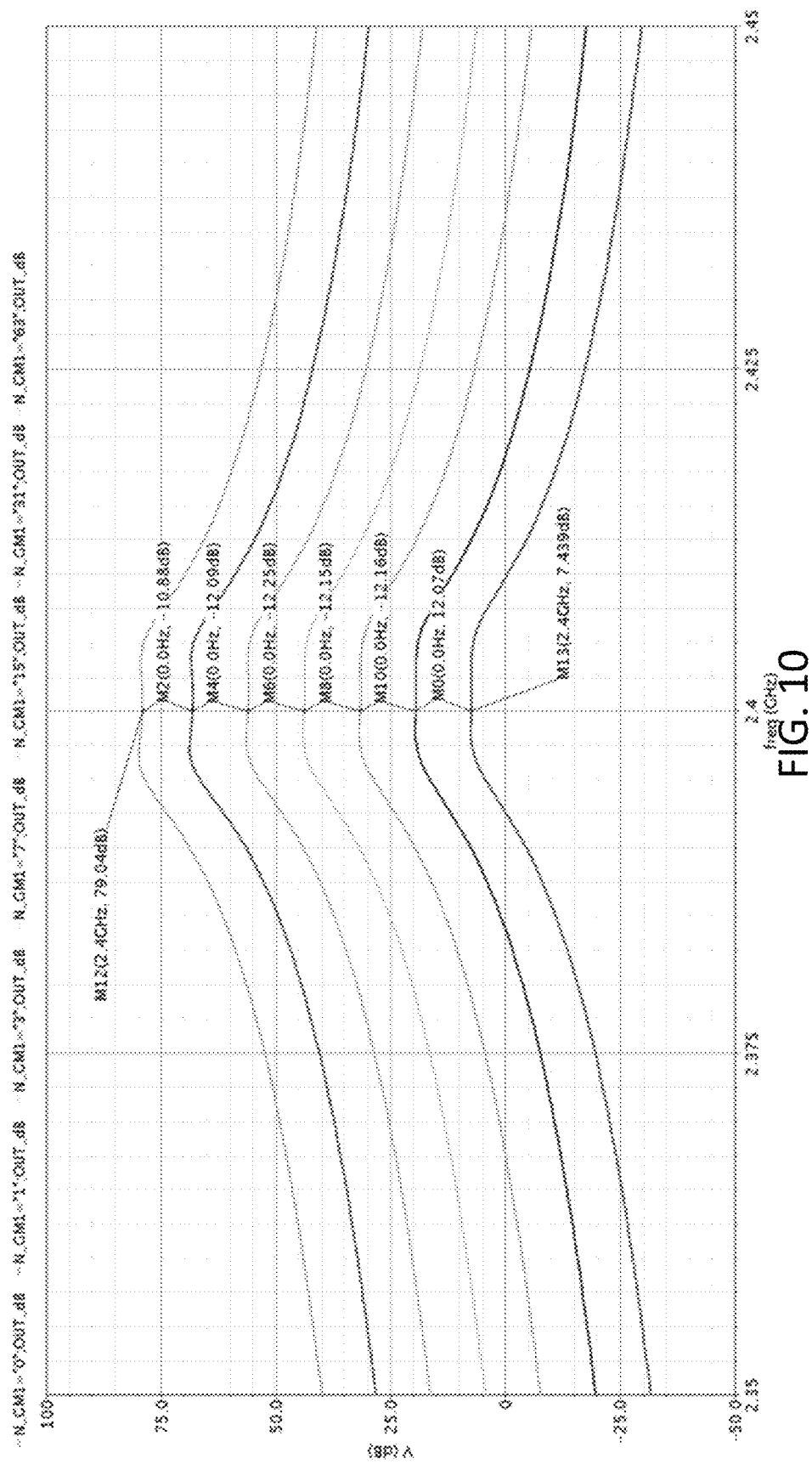
FIG. 10 is a plot of variable gain values in accordance with some embodiments.
Figure 11:
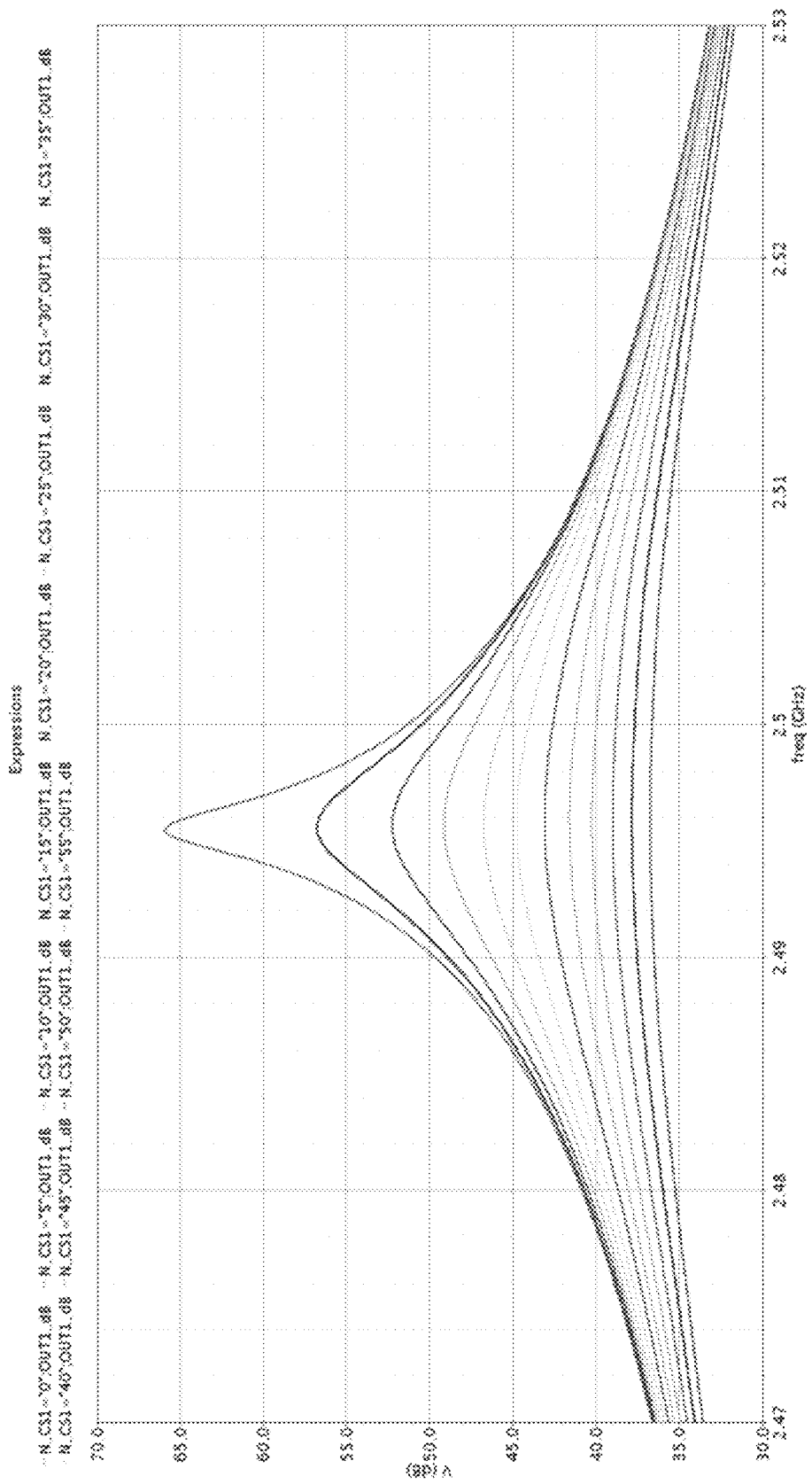
FIG. 11 is a signal plot showing Q values in accordance with some embodiments.
Figure 12:
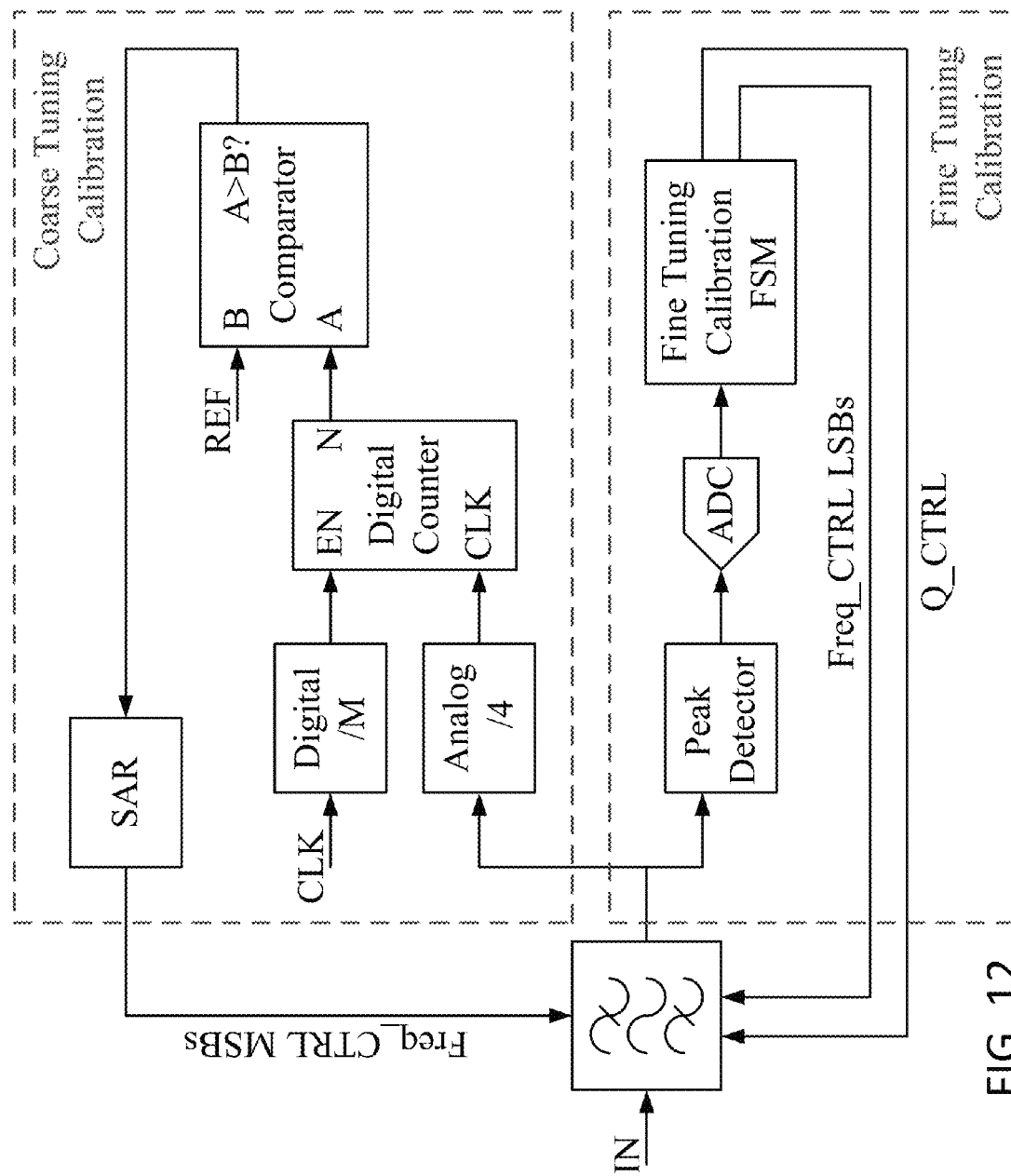
FIG. 12 is a control circuit configured to control the LNAs in accordance with some embodiments.

With reference to FIG. 10, some of the gain tuning steps are depicted. With reference to FIG. 11, some of the Q tuning steps are shown. One apparatus and method of controlling and/or calibrating the LNA stages is depicted in FIG. 12 in accordance with some embodiments.

The LNA controller 1200 may include a finite state machine to control the circuits and/or modules of the controller. The LNA may be driven to oscillation during one or more steps of the calibration. A frequency detector may comprise a digital divide by M to divide a clock signal, and an analog divide by 4 (or other number) circuit to reduce the frequency of the monitored oscillations from the LNA bandpass load in the form of an LC tank.

The LNA controller may be configured to provide a control output signal on the frequency control output line corresponding to the most significant bits from the coarse tuning circuit, and corresponding to the least significant bits from the fine tuning control circuit. These bits may be used to switch a capacitor bank to alter the resonant frequency of the bandpass load. In the coarse tuning mode, the Q of the LNA may be increased to point of causing the LNA to oscillate. The frequency at which the LNA resonates is related to the peak of the frequency response when not in oscillation. Thus, the oscillatory condition induced in the LNA may be used to coarsely adjust the tank circuit capacitance. In the fine tuning mode, the controller generates one or more tones and measures the amplitudes to determine both a 3 dB point (which measures the Q) as well as the frequency at which a peak output may be obtained, which corresponds to the center frequency of the bandpass filter. Other tones and measurements may also be used to determine a fine calibration of the LNA.

The control output may include multiple parallel bits for controlling the Q factor of the LNA stages. The LNA controller may responsively adjust the Q by altering a bias current in the bandpass load circuit.

Figure 5:
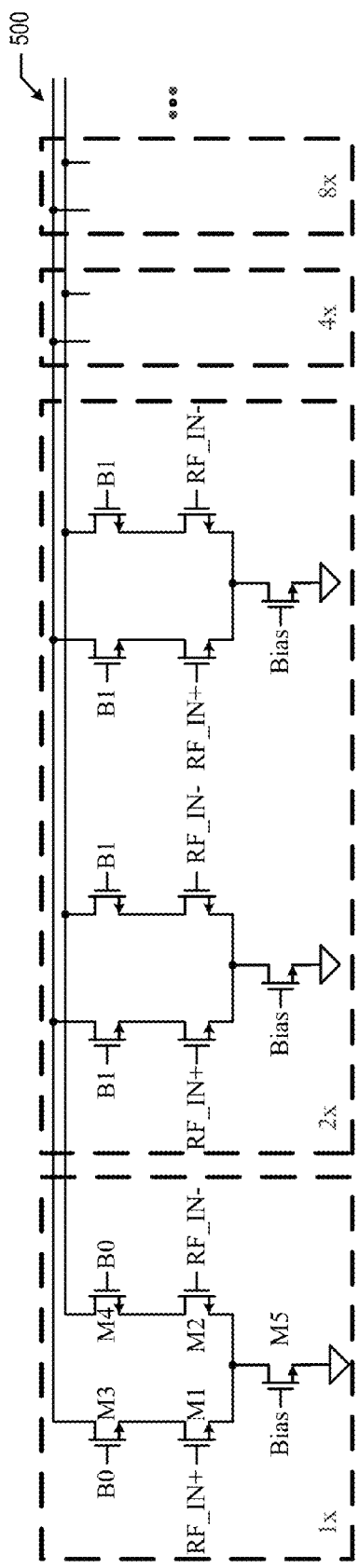
FIG. 5 is an implementation of cells used to provide digitally controlled variable gain in accordance with some embodiments.

With reference to LNA variable gain transconductance stage 400, the variable gain may be achieved by switching either ON or OFF additional transistor devices. One such variable transconductance stage is shown in FIG. 5. The gain control signal from the LNA controller may include numerous bits B0, B1, B2 etc. Control bit B0 may be used to control a first cell, control bit B1 may be used to control a second cell, and control bit B2 may be used to control a third cell. Note that the first, second and third cells each provide an increasing amount of transconductance amplification. The code may be referred to as a binary code in that each bit controls an amplification of twice the prior stage. In an alternative embodiment, each cell may add the same amount of gain, in which case the binary control word may be referred to as a thermometer code.

In one embodiment, the apparatus comprises a variable gain amplifier stage configured to accept an input signal and to provide a load driving signal, a tunable bandpass filter connected as a load to the variable gain amplifier stage, and a controller circuit configured to tune the bandpass filter. The bandpass filter includes a resonant tank, a cross-coupled transistor pair, and at least one cross-coupled compensation transistor pair biased in a subthreshold region. That compensation configuration adds a transconductance component when the load driving signal is of a magnitude large enough to decrease the transconductance of the cross-coupled transistor pair. Further, it may include a controller circuit configured to tune the bandpass filter. The bandpass filter may comprise a capacitor bank, and the controller circuit may be configured to adjust the capacitor bank to alter the center frequency of the bandpass filter. The controller circuit may be configured to alter a bias point of the cross-coupled transistors to vary the Q of the tank, to induce an oscillation in the bandpass filter, to measure the resonant frequency of the oscillation, and to adjust the resonant frequency of the bandpass filter. The variable gain stage amplifier may be a transconductance amplifier stage that has a plurality of parallel connected transconductance cells. In addition, the at least one cross-coupled compensation transistor pair may comprise a plurality of parallel-connected cross-coupled compensation transistor pairs. Each of the plurality of parallel-connected cross-coupled compensation transistor pairs may be biased at a different sub-threshold voltage. In an embodiment, a bias control circuit may be configured to adjust a sub-threshold bias voltage of the at least one cross-coupled compensation transistor pair. The control circuit may also be configured to adjust a quality factor Q of the first and second bandpass filters to obtain a desired adjacent channel rejection ratio.

Figure 13:
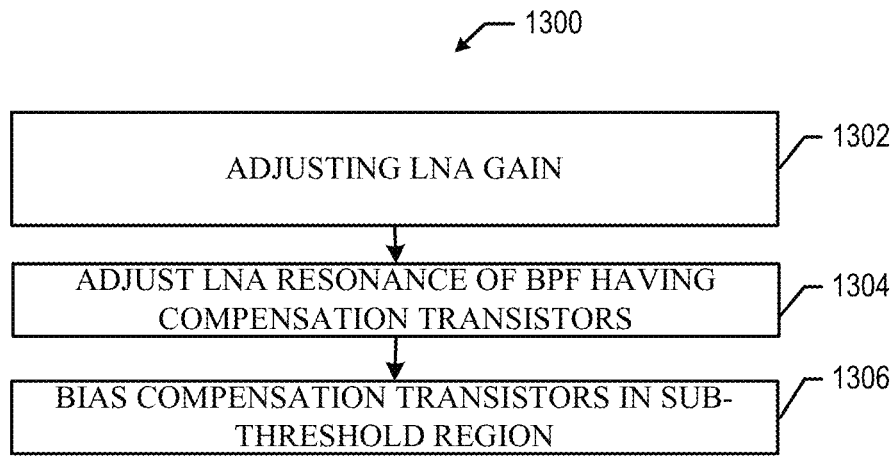
FIGS. 13 and 14 are flow charts depicting a method of LNA adjustment in accordance with some embodiments.

With reference to FIG. 13, a method will be described in accordance with some embodiments. A method 1300 may comprise: adjusting 1302 the gain of a variable gain amplifier stage; adjusting 1304 a resonant frequency and a Q of a tunable bandpass filter connected as a load to the variable gain amplifier stage; wherein the bandpass filter includes a cross-coupled transistor pair, and at least one cross-coupled compensation transistor pair; and 1306 biasing the at least one cross-coupled compensation transistor pair in subthreshold region. Note that the steps described do not require a specific sequence. In particular, as an example, the order may be reversed. A compensation may first be adjusted, then the resonant or center frequency and Q, and finally the gain. The method may include adjusting the resonant frequency of a tunable bandpass filter by adjusting a capacitor bank. In an embodiment, the method may further comprise adjusting a bias point of the cross-coupled transistors to induce an oscillation in the bandpass filter or resonant tank; measuring the resonant frequency of the oscillation; and, adjusting the resonant frequency of the bandpass filter. In an embodiment, the method may comprise adjusting a bias point of the cross-coupled transistors to tune the Q of the resonant tank. The method may include adjusting the gain of the variable gain stage amplifier by switching on or off a plurality of parallel connected transconductance cells. The at least one cross-coupled compensation transistor pair may comprise a plurality of parallel-connected cross-coupled compensation transistor pairs, and the method may further comprise setting the bias voltage at a different subthreshold voltage for each of the plurality of parallel-connected cross-coupled compensation transistor pairs. The method may also comprise adjusting a sub-threshold bias voltage of the at least one cross-coupled compensation transistor pair.

Figure 14:
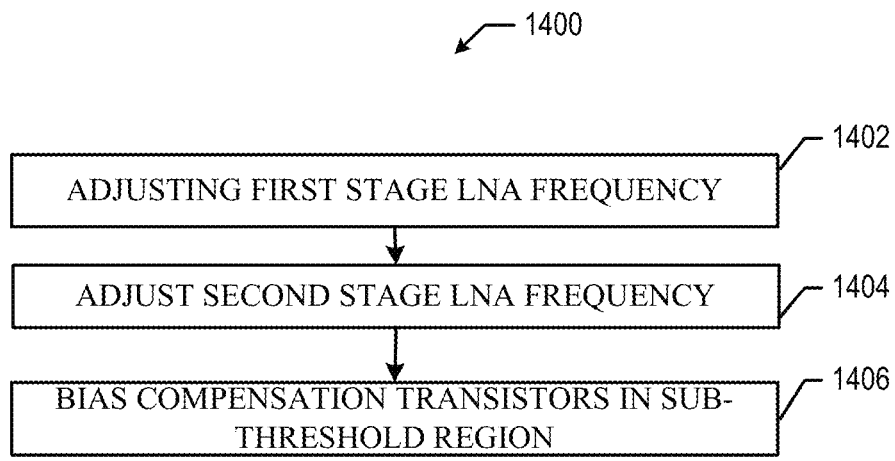

An additional method 1400 of FIG. 14 may comprise adjusting 1402, to a first frequency, a resonant frequency of a first low noise amplifier stage having a first variable gain amplifier stage and a first tunable bandpass filter; adjusting 1404, to a second frequency offset from the first frequency, a resonant frequency of a second low noise amplifier stage having a second variable gain amplifier stage and a second tunable bandpass filter; and, biasing 1406 cross-coupled compensation transistor pairs in each of the first tunable bandpass filter and second tunable bandpass filter in a sub-threshold region to provide a compensation transconductance in the presence of large signals. Again, not that the order of steps presented is not limiting. The method 1400 may be performed by first baising the compensation transistors. The frequency and Q of the LNA stages may then be adjusted. The first frequency and second frequency may be selected in accordance with a desired channel frequency. The quality factor Q of the first and second bandpass filters may be adjusted to obtain a desired adjacent channel rejection ratio. The adjusting steps of the first and second bandpass filter resonant frequencies may comprise adjusting a bias point of the cross-coupled transistors to induce an oscillation in the respective bandpass filter; measuring the resonant frequency of the oscillation; and, adjusting the resonant frequency of the respective bandpass filter.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Accordingly, some embodiments of the present disclosure, or portions thereof, may combine one or more processing devices with one or more software components (e.g., program code, firmware, resident software, micro-code, etc.) stored in a tangible computer-readable memory device, which in combination form a specifically configured apparatus that performs the functions as described herein. These combinations that form specially programmed devices may be generally referred to herein "modules". The software component portions of the modules may be written in any computer language and may be a portion of a monolithic code base, or may be developed in more discrete code portions such as is typical in object-oriented computer languages. In addition, the modules may be distributed across a plurality of computer platforms, servers, terminals, and the like. A given module may even be implemented such that separate processor devices and/or computing hardware platforms perform the described functions.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. An apparatus comprising:
a variable gain amplifier stage configured to accept an input signal and to provide a load driving signal;
a tunable bandpass filter connected as a load to the variable gain amplifier stage, wherein the bandpass filter includes a resonant tank, a cross-coupled transistor pair, and at least one cross-coupled compensation transistor pair biased in a subthreshold region configured to add a transconductance component when the load driving signal is of a magnitude large enough to decrease the transconductance of the cross-coupled transistor pair; and,
a controller circuit configured to tune the bandpass filter.

2. The apparatus of claim 1 wherein the bandpass filter comprises a capacitor bank, and the controller circuit is configured to adjust the capacitor bank to alter the frequency response of the bandpass filter.

3. The apparatus of claim 1 wherein the controller circuit is configured to alter a bias point of the cross-coupled transistors to induce an oscillation in the bandpass filter, to measure the resonant frequency of the oscillation, and to adjust the resonant frequency of the bandpass filter.

4. The apparatus of claim 1 wherein the controller circuit is configured to alter a bias point of the cross-coupled transistors to adjust the Q of the bandpass filter.

5. The apparatus of claim 1 wherein the variable gain stage amplifier is a transconductance amplifier stage have a plurality of parallel connected transconductance cells.

6. The apparatus of claim 1 wherein the at least one cross-coupled compensation transistor pair comprises a plurality of parallel-connected cross-coupled compensation transistor pairs.

7. The apparatus of claim 6 wherein each of the plurality of parallel-connected cross-coupled compensation transistor pairs is biased at a different subthreshold voltage.

8. The apparatus of claim 1 further comprising a bias control circuit configured to adjust a sub-threshold bias voltage of the at least one cross-coupled compensation transistor pair.

9. The apparatus of claim 1 wherein the variable gain amplifier stage and the tunable bandpass filter are a first low noise amplifier stage tuned to a first frequency, and further comprising a second low noise amplifier stage having a second variable gain amplifier stage and a second tunable bandpass filter, the second low noise amplifier stage tuned to a second frequency and connected serially with the first low noise amplifier stage.

10. The apparatus of claim 9 wherein the first frequency and second frequency are selected in accordance with a desired channel frequency.

11. The apparatus of claim 9, wherein the control circuit is further configured to adjust a quality factor Q of the first and second bandpass filters to obtain a desired overall bandwidth and adjacent channel rejection ratio.

12. A method comprising:
adjusting the gain of a variable gain amplifier stage;
adjusting a resonant frequency and a Q of a tunable bandpass filter connected as a load to the variable gain amplifier stage, wherein the bandpass filter includes a cross-coupled transistor pair, and at least one cross-coupled compensation transistor pair; and,
biasing the at least one cross-coupled compensation transistor pair in a subthreshold region.

13. The method of claim 12 further comprising:
adjusting a bias point of the cross-coupled transistors to induce an oscillation in the bandpass filter;
measuring the resonant frequency of the oscillation; and,
adjusting the resonant frequency of the bandpass filter.

14. The method of claim 12 further comprising adjusting a bias point of the cross coupled transistors to adjust the Q in the bandpass filter.

15. The method of claim 12 wherein the at least one cross-coupled compensation transistor pair comprises a plurality of parallel-connected cross-coupled compensation transistor pairs further comprising:
setting the bias voltage at a different subthreshold voltage for each of the plurality of parallel-connected cross-coupled compensation transistor pairs.

16. The method of claim 12 further comprising adjusting a sub-threshold bias voltage of the at least one cross-coupled compensation transistor pair.

17. A method comprising:
adjusting, to a first frequency, a resonant frequency of a first low noise amplifier stage having a first variable gain amplifier stage and a first tunable bandpass filter;
adjusting, to a second frequency offset from the first frequency, a resonant frequency of a second low noise amplifier stage having a second variable gain amplifier stage and a second tunable bandpass filter;
biasing cross-coupled compensation transistor pairs in each of the first tunable bandpass filter and second tunable bandpass filter in a sub-threshold region to provide a compensation transconductance in the presence of large signals.

18. The method of claim 17 wherein the first frequency and second frequency are selected in accordance with a desired channel frequency.

19. The method of claim 17, further comprising adjusting a quality factor Q of the first and second bandpass filters to obtain a desired overall bandwidth and adjacent channel rejection ratio.

20. The method of claim 17 wherein each of the adjusting steps of the first and second bandpass filter resonant frequencies comprises:
adjusting a bias point of the cross-coupled transistors to induce an oscillation in the respective bandpass filter;
measuring the resonant frequency of the oscillation; and,
adjusting the resonant frequency of the respective bandpass filter.

* * * * *